(12) United States Patent
Ni et al.

(10) Patent No.: US 12,309,891 B2
(45) Date of Patent: May 20, 2025

(54) CONTROL METHOD FOR MULTI-ZONE ACTIVE-MATRIX TEMPERATURE CONTROL IN PLASMA PROCESSING APPARATUS

(71) Applicant: ADVANCED MICRO-FABRICATION EQUIPMENT INC. CHINA, Shanghai (CN)

(72) Inventors: Tuqiang Ni, Shanghai (CN); Rason Zuo, Shanghai (CN); Dee Wu, Shanghai (CN); Sha Rin, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 975 days.

(21) Appl. No.: 17/325,007

(22) Filed: May 19, 2021

(65) Prior Publication Data

US 2022/0005677 A1   Jan. 6, 2022

Related U.S. Application Data

(62) Division of application No. 15/380,979, filed on Dec. 15, 2016, now abandoned.

(30) Foreign Application Priority Data

Dec. 24, 2015  (CN) .......................... 201510982823.3

(51) Int. Cl.
*H05B 41/282*  (2006.01)
*H01J 37/32*  (2006.01)
(Continued)

(52) U.S. Cl.
CPC .... *H05B 41/2828* (2013.01); *H01J 37/32532* (2013.01); *H01J 37/32724* (2013.01);
(Continued)

(58) Field of Classification Search
None
See application file for complete search history.

(56) References Cited

U.S. PATENT DOCUMENTS 6,599,787 B2   7/2003  Trainor et al.
6,643,363 B1   11/2003  Miura
(Continued)

FOREIGN PATENT DOCUMENTS

CN   102668058 A   9/2012
CN   103828031 A   5/2014
(Continued)

OTHER PUBLICATIONS

Translation of TW-200929153-A (Year: 2009).*

*Primary Examiner* — Elizabeth M Kerr
(74) *Attorney, Agent, or Firm* — Womble Bond Dickinson (US) LLP (57) ABSTRACT

Method for multi-zone temperature control system having temperature control matrix and gate driver; N*M temperature control modules form N-row M-column matrix, power supply line, and power return line; each temperature control module comprising: a temperature control unit adapts to be heated up by electrical power for temperature controlling; semiconductor switch provided with a gate electrode connected with the gate driver, two ends of the gate being connected with the power supply line, and the power return line through the temperature control unit, respectively. In the temperature control matrix, one ends, which are connected with a power return line, of the temperature control units of temperature control modules in a same row or same column (Continued)

are serially connected, and connected with the power supply line; one ends, which are connected with the power supply line at same row or same column are serially connected, and connected with the power supply line.

16 Claims, 2 Drawing Sheets

(51) Int. Cl.
    *H01K 13/02*     (2006.01)
    *H01L 21/67*     (2006.01)
    *H01L 21/683*     (2006.01)
    *H05B 39/04*     (2006.01)
    *H05B 39/06*     (2006.01)

(52) U.S. Cl.
    CPC ....... *H01K 13/02* (2013.01); *H01L 21/67248* (2013.01); *H01L 21/6831* (2013.01); *H01L 21/6833* (2013.01); *H05B 39/04* (2013.01); *H05B 39/06* (2013.01); *H01J 2237/3341* (2013.01)

(56) References Cited

U.S. PATENT DOCUMENTS

| | | | |
|---|---|---|---|
| 8,637,794 | B2 | 1/2014 | Singh et al. |
| 10,199,246 | B2 | 2/2019 | Koizumi et al. |
| 2004/0018127 | A1* | 1/2004 | Long ................. H01L 21/67069 |
| | | | 422/186.04 |
| 2010/0167959 | A1 | 7/2010 | Johnson et al. |
| 2011/0092072 | A1* | 4/2011 | Singh ...................... C23C 14/50 |
| | | | 156/345.52 |

FOREIGN PATENT DOCUMENTS

| | | | | |
|---|---|---|---|---|
| JP | 2001094670 A | | 4/2001 | |
| JP | 2009094524 A | | 4/2009 | |
| KR | 20000044195 A | | 7/2000 | |
| KR | 20120103596 A | | 9/2012 | |
| TW | 200929153 A | * | 7/2009 | ........... G09G 3/3677 |
| TW | 201523786 A | | 6/2015 | |
| WO | WO-9705519 A1 | * | 2/1997 | ....... G02F 1/133382 |
| WO | 2013025852 A1 | | 2/2013 | |

\* cited by examiner

CONTROL METHOD FOR MULTI-ZONE ACTIVE-MATRIX TEMPERATURE CONTROL IN PLASMA PROCESSING APPARATUS

RELATED APPLICATIONS

This application is a divisional of co-pending U.S. Patent Application No. 15/380,979, filed on Dec. 15, 2016, which claims priority benefit from Chinese Patent application Ser. No. 20/151,0982823.3, filed on Dec. 24, 2015, and the entire contents of these applications are incorporated herein by reference.

FIELD OF THE INVENTION

The present invention relates to the field of semiconductor manufacturing technologies, and more specifically relates to a multi-zone active-matrix temperature control system, a temperature controlling method, and an electrostatic chuck and a plasma processing apparatus apply thereof.

BACKGROUND OF THE INVENTION

With the development of semiconductor technologies, the requirements on uniformity and critical dimension (CD) during a manufacturing process of wafers have become increasingly stricter. Currently wide used heating electrostatic chucks that have less than 10 zones (usually 3-4 zones) gradually fail to satisfy these increasingly stricter requirements.

It is desirable to design an electrostatic chuck having more heating zones (e.g., 100·400 zones) so as to satisfy high demand on uniformity and critical dimension during the manufacturing process of wafers. If a traditional design method is used, each heating zone of electrostatic chuck needs one power supply line and one power return line, consequently a heating electrostatic chuck with more than 100 zones must include more than 100 power supply lines and more than 100 power return lines, which is a great challenge for structural design of the electrostatic chuck. For example, for a 300 mm or 450 mm diameter electrostatic chuck, structurally it is rather hard or even impossible to arrange so many power supply lines, and it is also a big problem to lead these power supply lines out from the electrostatic chuck to a controller.

SUMMARY OF THE INVENTION

The present invention discloses a multi-zone active-matrix temperature control system, a temperature method, and an electrostatic chuck and a plasma processing apparatus that apply a same, which may perform a precise temperature control to each zone of the electrostatic chuck and significantly reduce the number of electrostatic chuck lead-out lines.

In order to achieve the objectives above, the present invention provides a multi-zone active-matrix temperature control system, wherein, said temperature control system has a temperature control matrix and a gate driver; the temperature control matrix comprises: N*M temperature control modules forming a N-row M-column matrix, power supply lines, and power return lines;

each temperature control module comprising:

a temperature control unit adapts to be heated up by electrical power for temperature controlling;

a semiconductor switch provided with a gate electrode connected to the gate driver, the other two electrodes of the semiconductor switch, being connected with the power supply line, and the power return line through the temperature control unit, respectively, in the temperature control matrix, each of the temperature control modules in a same row or same column of the temperature control matrix has a temperature control unit, wherein the first ends of said temperature control units are serially connected to a common power return line, and each of the temperature control modules in a same row or a same column of the temperature control matrix has a semiconductor switch serially connects, to a common power supply line.

In the temperature control matrix,

Every temperature control units of all temperature control modules are connected to a common power return line;

the semiconductor switches in the temperature control modules in the same column; M columns of temperature control modules respectively connect to; M power supply lines, the M power supply lines selectively supply power to the temperature control modules in their respective connected columns;

Gate electrodes of semiconductor switches of temperature control modules in a same row are serially connected to a common gate driving line; N rows of temperature control modules connect to N gate driving lines; the N gate driving lines are connected with one or more gate drivers, respectively; the gate driver controls the N rows of temperature control modules, respectively.

In the temperature control matrix, the temperature control units of all temperature control modules are connected to one common power return line;

the semiconductor switches of all temperature control modules are connected to a common power supply line;

the gate electrode of semiconductor switch in each temperature control module is connected at least one gate driver; the gate driver controls each temperature control module, respectively.

The semiconductor switches is TFT film transistors or triodes.

An electrostatic chuck, an electrostatic adsorption assembly is set in top portion of the electrostatic chuck for fixing a wafer, the multi-zone active-matrix temperature control system is provided in the electrostatic chuck.

The electrostatic chuck further includes an overall temperature control system above or below the multi-zone active-matrix temperature control system, the overall temperature control system used for controlling overall temperature distribution in every temperature control modules.

The gate driver is integrated inside the electrostatic chuck or provided outside of the electrostatic chuck.

A plasma processing apparatus, comprising a plasma reaction chamber a base for placing a wafer is set at bottom of inner space of the plasma reaction chamber, characterized in that the electrostatic chuck is provided in the base.

A temperature control method for a multi-zone active-matrix temperature control system, characterized in that the multi-zone active-matrix temperature control system comprises a temperature control matrix and a gate driver; the temperature control matrix comprises: temperature control modules forming a matrix, a power supply line, and a power return line; each temperature control module comprises: a temperature control unit; a semiconductor switch with a gate electrode connected to the gate driver, the semiconductor switch further including other two electrodes first electrode being connected to the power supply line, respectively, and second electrode connected to the power return line through the temperature control unit;

The temperature control method comprising:

supplying power, by the power supply line, to the temperature control modules in a temperature adjusting zone;

turning on, the semiconductor switches corresponding to the temperature adjusting zone by the gate driver;

powering on and heating up the temperature control units in the temperature adjusting zone.

All temperature control modules are connected with a power return line; one ends, which are connected to a common power supply line, the first electrodes of semiconductor switches of temperature modules in a same column are serially connected; the temperature control modules in one common column are connected to one line of power supply lines, respectively; gate electrodes of semiconductor switches of temperature control modules in a same row are serially connected; the temperature control modules in one common row are connected to one line of gate driver output lines, respectively;

The temperature control method comprises:

supplying driving signal, by the gate driver, turning on semiconductor switches in the temperature control modules determined by said driving signal for a unit time and then off;

when the gate driver turns on the semiconductor switches of temperature control modules in the temperature adjusting zone where the gate driver is located, supplying power, by the power supply line, to the temperature control modules in the column where the temperature adjusting zone The manner in which the gate driver turns on semiconductor switches of part of temperature control modules is that: the gate driver sweeps, row by row according to a preset sequence, to trigger turn on the semiconductor switches of the temperature control modules for a unit time and then off.

The manner in which the gate driver turns on semiconductor switches of part of temperature control modules is that: determining a row defined by temperature adjusting zone, the gate driver turns on semiconductor switches of the temperature control modules in the corresponding row for a unit time and then off.

All temperature control modules are connected with one power return line and one power supply line; each semiconductor switch of each temperature control module are connected with one line of gate driver output, respectively;

The temperature control method comprises:

turning on the semiconductor switches of the temperature control modules in the temperature adjusting zone, and supplying power, by the power supply line, to the temperature control modules whose semiconductor switches are turned on.

The power supply line supplies heating power to the temperature control units in temperature adjusting zone. wherein the voltage, current, or power supply duration of heating power has variable duty cycle.

Compared with an etching temperature control technology in the prior art, the multi-zone active-matrix temperature control system and temperature control method, and an electrostatic chuck and a plasma processing apparatus that apply a same according to the present invention have the following advantages: by sweeping the power supply line of the temperature control units and scanning the gate electrodes triggering the semiconductor switches, the present invention may precisely control each temperature control zone within the electrostatic chuck; meanwhile, due to different scanning objects, by turning on all semiconductor switches and power supply lines, the temperature control units of all temperature control zones within the whole electrostatic chuck can be turned on;

By providing semiconductor switches and gate drives to control the temperature control matrix, the present invention solves the problem of too many lead-out lines caused by a need of equipping a pair of power supply line and power return line to each temperature control module, thereby reducing the number of lead-out lines from the electrostatic chuck and further simplifying radio frequency filtering at a backend to these power supply lines and power return lines; meanwhile, if the gate driver is integrated into the electrostatic chuck, the number of lead-out lines from the electrostatic chuck can be further significantly reduced.

In the present invention, each temperature control module is independent from one another and there is no electrical interference among temperature control modules; therefore, control of the temperature zones within the electrostatic chuck is highly flexible and accurate, which may implement arbitrary independent control of individual temperature control modules, without any restriction; meanwhile, by controlling switching frequency and switching time of the semiconductor switches of each temperature control zone, the objective of controlling the temperature control duty cycle of each temperature control zone will be achieved.

DETAILED DESCRIPTION OF THE PREFERRED EMBODIMENTS

Hereinafter, the preferred embodiments of the present invention will be further illustrated.

The present invention discloses a plasma processing apparatus that may implement multi-zone active-matrix temperature control. The plasma processing apparatus comprises a plasma reaction chamber. The shape of the plasma reaction chamber is not limited to a cylindrical shape, which, for example, may also be a horn shape. When performing plasma etching, a reaction gas is supplied to the plasma reaction chamber. Corresponding upper electrode and lower electrode are provided within the plasma reaction chamber to excite the reaction gas for generating plasma, such that during a manufacturing process, plasma is fully filled within the plasma reaction chamber.

A base for placing a wafer is provided at a bottom of the plasma reaction chamber. An electrostatic chuck for adsorbing the wafer is provided in the base. A temperature control system such as a heater or a coolant flow path is provided within the electrostatic chuck or base as needed. In actual applications, the lower electrode may be provided within the base.

The present invention discloses an electrostatic chuck. The electrostatic absorption assembly for fixing the wafer is provided at a top of the electrostatic chuck. Further, a temperature control system that may perform multi-zone active-matrix temperature control may be provided within the electrostatic chuck. The temperature control system includes a temperature control matrix and a gate driver line. The temperature control matrix comprises: N*M temperature control modules forming an N-row M-column matrix, a power supply line, and a power return line. Each temperature control module comprises: a temperature control unit adapts to be heated up by electrical power for temperature controlling; a semiconductor switch provided with a gate electrodes connected with the gate driver, two ends, which turn on or off, of the gate electrodes being connected with the power supply line and the temperature control unit, respectively. In the temperature control matrix, power return ends of temperature control units of temperature control modules in a same row or column are serially connected, and connected to one common power return line. One ends, which are connected with the power supply line, of the semiconductor switches of temperature control modules in a same row or column are serially connected, and semiconductor switches of all temperature control modules are connected with one or more power supply lines. The semiconductor switches of the temperature control modules are connected with the gate driver by serial connection in one row or in one column, respectively, or all semiconductor switches are separately connected with the gate driver, respectively.

In actual applications, the semiconductor switches adopt TFT film transistors or triodes, etc. If the TFT film transistors are adopted, gate electrodes of these film transistors may be integrated onto one gate driver. Common numbers of output channels of a gate driver are 200 outputs, or 192 outputs, or 256 outputs, or 263 outputs. The output channels suffice to meet the requirement on the number of temperature control units (heaters) of a multi-zone temperature control electrostatic chuck. It is also so for other kinds of semiconductor switches. The integrated gate driver for the semiconductor switches, dependent on the size, may be directly designed inside or outside of the electrostatic chuck.

The working principle of the temperature control system is that: the power supply line supplies power to all or a column or a row of temperature control modules where a zone needs temperature control is located in the electrostatic chuck; meanwhile, the gate driver, according to the temperature adjusting zone, drives on the semiconductor switches of one row or one column or a specified number of temperature control modules where the corresponding zone is located; after the temperature control modules corresponding to the temperature adjusting zone receive power supply, their temperature control units adapts to be heated up by electrical power, thereby performing temperature controlling to the temperature adjusting zone.

Preferably, in the electrostatic chuck, a total temperature control system for overall heating and temperature control, as a main heater, may be provided above or below the multi-zone active-matrix temperature control system, to satisfy the function of heating the entirety of the electrostatic chuck.

Figure 1:
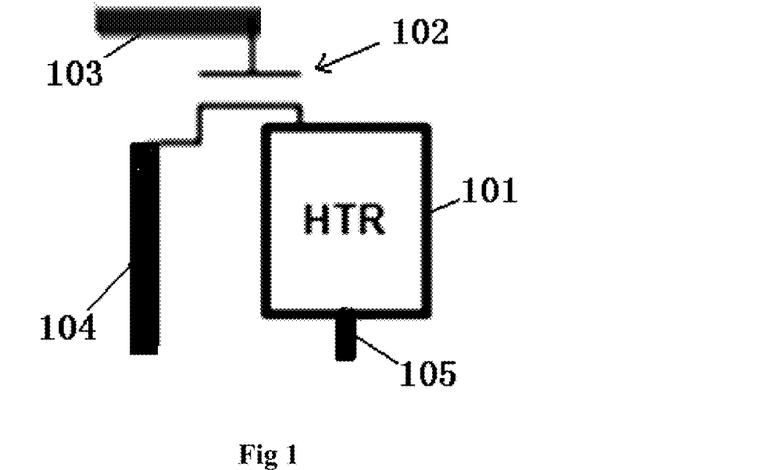
FIG. 1 illustrates a circuit diagram of a temperature control module for multi-zone active-matrix temperature control in the present invention.

FIG. 1 illustrates a temperature control module that may perform multi-zone active-matrix temperature control. The temperature control module comprises a temperature control unit 101 and a semiconductor switch 102. The semiconductor switch 102 adopts a TFT film transistor or triode, etc. A gate of the semiconductor switch is connected with a gate driving line 103. A source and a drain, which are turned on or off by the gate electrode, serving as a power supply end and a power return end, are connected with a power supply line 104 and a power return line 105, respectively. When the gate electrode of the semiconductor switch 102 turns on the source and the drain on, the circuit conduction of the power supply line 104 and the power return line 105 is implemented. The temperature unit 101, e.g., a heating disc (heater, HTR), is connected between the power return end of the semiconductor switch 102 and the power return line 105. When the gate electrode turns on the semiconductor switch 102 on, the power supply line 104 and the power return line 105 are circuit conducted, and then the power supply line 104 (suppose the power supply line 104 is applied voltage at this point) supplies power to the temperature control unit 101, and the temperature control unit 101 heats the temperature control zone of the electrostatic chuck where it is located to perform temperature control; when the semiconductor switch 102 is not turned on, the temperature control unit 101 does not work.

Figure 2:
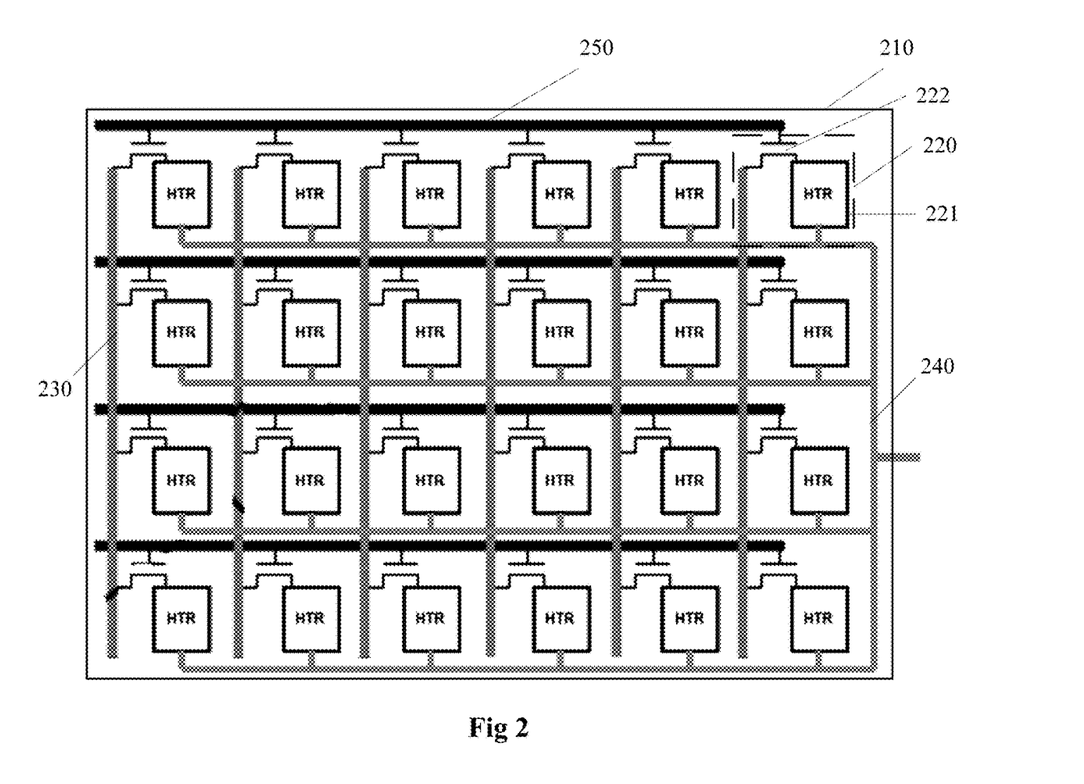
FIG. 2 illustrates a circuit diagram of a first embodiment of a temperature control system for multi-zone active-matrix temperature control in the present invention.

FIG. 2 illustrates a first embodiment of a multi-zone active-matrix temperature control system. The temperature control system comprises a temperature control matrix 210 and a gate drier; the temperature control matrix 210 comprises: 4*6 temperature control module 220 forming a 4-row 6-column matrix, a power supply line 230, a power return line 240, and a gate driving line 250.

Each temperature control module 220 comprises: a temperature control unit 221 and a semiconductor switch 222. The semiconductor switch 222 adopts a TFT film transistor or triode, etc. A gate of the semiconductor switch 222 is connected with the gate driving line 250. A source and a drain, which are turned on or off by the gate electrode, serving as a power supply end and a power return end, are connected with the power supply line 230 and the power return line 240, respectively. When the gate of the semiconductor switch 222 turns on the source and the drain on, circuit conduction between the power supply line 230 and the power return line 240 is achieved. The temperature control unit 221 is connected between the power return end of the semiconductor switch 222 and the power return line 240. The temperature control unit 221 is for electrical heating to perform temperature control.

In the first embodiment, after one ends, which are connected with the power return line 240, of the temperature control units of six temperature control modules 220 in a same row of the matrix are serially connected, and one ends, which are connected with the power return line 240, of temperature control units 221 in different rows are parallel connected, they are connected with one power return line 240, thereby achieving that all temperature control units 221 are connected with one common power return line.

One ends, which are connected with the power supply line, of the semiconductor switches 222 of four temperature control modules 220 in a same column are serially connected. 6 columns of temperature control modules 220 correspond to six power access ends. The six power access ends are connected with six lines of power supply lines 230, respectively. The six lines of power supply lines 230 perform power supply control to the temperature control modules 220 in their respectively accessed columns, respectively.

Gate electrodes of the semiconductor switches 222 of six temperature control modules 220 in a same row are serially connected and connected with one gate driving line 250; four rows of temperate control modules 220 lead out four gate driving lines 250. The four gate driving lines 250 are connected with different output channels of one or more gate drivers, respectively. The gate drivers perform drive control to four rows of temperature control modules 220, respectively.

With an electrostatic chuck of a matrix temperature control system comprising N square temperature control modules as an example, in order to implement individual work of the N square temperature control modules, the prior art electrostatic chuck having a temperature control system needs to be equipped in total with N ports for connecting power supply lines and N ports for connecting power return lines. However, if the system structure revealed in the first embodiment is adopted, the situation will be significantly different from the prior art: when the gate driver is disposed outside of the electrostatic chuck, it only needs N gate driving lines, N power supply lines, and one power return line; then the total number of lead-in and lead-out lines of the multi-zone active-matrix temperature control system is (2N+1); if the integrate gate driver has a very small size and is directly designed within the electrostatic chuck, it only needs N power supply lines, one gate driving line, and one power return line, such that the total number of lead-in and lead-out lines is (N+2). As discussed above, the system revealed in the first embodiment simplifies the number of power supply lines and power return lines and further simplifies RF filtering of these lines at the backend.

A temperature control method of the multi-zone active-matrix temperature control system according to the first embodiment comprises the following steps:

Step 1.1: a gate driver outputs a gate drive instruction in a pulse signal form according to a preset time sequence;

Step 1.2: the gate driver turns on semiconductor switches of part or all of temperature control modules on for a unit time and then off.

Step 1.3: switching on, according to a location of a zone which needs temperature control of the electrostatic chuck, power supply lines 230 in a corresponding column, so as to control the temperature control modules 220 on or off in the temperature adjusting zone.

Step 1.4: the semiconductor switches 222 of the temperature control module 220 are turned on; when the power supply line 230 supplies power thereto, the temperature control units 221 heat to perform temperature control to the electrostatic chuck.

Further, when executing the temperature control method above, by adjusting the accessed voltage or current or switching-on time of the corresponding power supply line 230, control of duty cycle of the temperature adjusting zone may be realized.

In steps 1.2 and 1.3 of the present embodiment, work cooperation between the gate driver turning on the semiconductor switches and the power supply line supplying power specifically has the following three work schemes:

Scheme 1: the gate driver simultaneously turns on the semiconductor switches of all temperature control modules 220, specifically comprising:

Step 1.2: the gate driver simultaneously transmits a trigger signal to the semiconductor switches of all temperature control modules 220 to turn on the semiconductor switches of all temperature control modules on for a unit time and then off.

Step 1.3: while the gate driver turns on and conducts all semiconductor switches 222, it switches on power supply lines 230 in a specified column at a location of a zone which needs temperature control in the electrostatic chuck, so as to supply power to the temperature control module 220 of the temperature adjusting zone, thereby implementing on/off control of the temperature control modules 220.

Further, all power supply lines 230 may be simultaneously switched on to implement overall temperature control to the electrostatic chuck.

Scheme 2: the gate drive sweeps to turn on the semiconductor switches of the temperature control module 220, specifically comprising:

Step 1.2: a clock is designed to perform a synchronization action; pulse signals outputted by the gate driver sequentially sweep row by row according to a time sequence to turn on the semiconductor switches 222 of the temperature control module 220, such that the semiconductor switches 222 are on sequentially per row for a unit time and then off.

Step 1.3: while the gate driver turns on respective semiconductor switches 222 such that the temperature control modules 220 are conducted by sweeping, according to the location of the zone which needs temperature control in the electrostatic chuck, power supply lines 230 in corresponding columns are switched on to perform conduction and power supply to the temperature control modules 220 in the temperature adjusting zone, thereby performing on or off control of the temperature adjusting zone.

Specifically, when the gate driver sweeps till the row where the temperature adjusting zone, the power supply line 230 may switch on the temperature control modules 220 in the column where the zone that needs temperature control is located to implement power supply; or, the power supply lines 230 consistently switches on the column where the zone that needs temperature control is located, and the gate driver sweeps till the row where the zone that needs temperature control is located, thereby implementing conduction and power supply.

Scheme 3. The gate driver directly turns on the semiconductor switches of the temperature control modules 220 according to distribution of the temperature adjusting zone, specifically comprising:

Step 1.2: the gate driver triggers, according to a specified row where the temperature adjusting zone, semiconductor switches 222 of the temperature control modules 220 on in the corresponding row on for a unit time and then off.

Step 1.3: while the gate drivers turn on respective semiconductor switches 222 such that the temperature control modules 220 in the row where the temperature adjusting zone are conducted, the power supply lines 230 in the column where the temperature adjusting zone are switched on to perform conduction and power supply to the temperature control modules 220 in the temperature adjusting zone, thereby implementing on or off control of the temperature adjusting zone.

The multi-zone active-matrix temperature control system disclosed in the first embodiment also differs from the first prior art in that the time-domain multiplexing scheme of the prior art implements accurate control of each temperature adjusting zone by directly sweeping the power supply lines and power return lines of the temperature control modules, but cannot simultaneously control all zones that need temperature control within the electrostatic chuck; however, the scheme in first embodiment can precisely control each temperature adjusting zone within the electrostatic chuck by sweeping the power supply line 230 of the temperature control modules and the gate driving line 250 of the semiconductor switches; meanwhile, due to different sweeping objects, by switching on all of the semiconductor switches 222 and the power supply lines 230, it may implement control of switching on all of the temperature control modules 220 in all zones that need temperature control within the entire electrostatic chuck.

Figure 3:
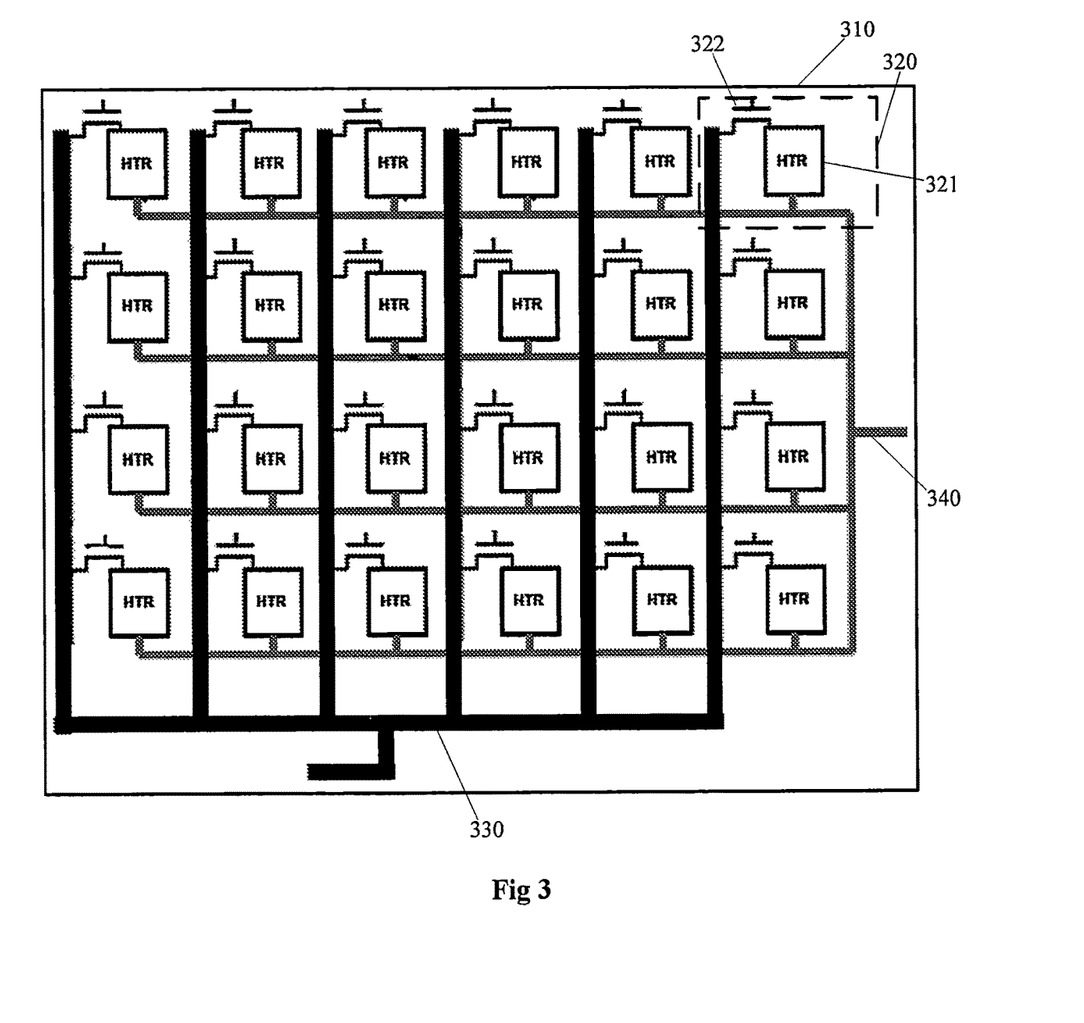
FIG. 3 illustrates a circuit diagram of a second embodiment of a temperature control system for multi-zone active-matrix temperature control in the present invention.

FIG. 3 illustrates a second embodiment of a multi-zone active-matrix temperature control system. The temperature control system comprises a temperature control matrix 310 and a gate driver; the temperature control matrix 310 comprises 4*6 temperature control modules 320 forming a 4-row 6-column matrix, a power supply line 330, and a power return line 340.

Each temperature control module 320 comprises: a temperature control unit 321 and a semiconductor switch 322. The semiconductor switch 322 adopts a TFT film transistor or a triode, etc., a gate electrode of which is connected with the gate driver. A source and a drain that are turned on or off by the gate serve as a power supply end and a power return end, which are connected with the power supply line 330 and the power return line 340, respectively. When the gate of the semiconductor switch 322 turns on the source and the drain on, circuit conduction between the power supply line 330 and the power return line 340 is achieved. The temperature control unit 321 is connected between the power return end of the semiconductor switch 322 and the power return line 340. The temperature control unit 321 is for electrically heating for temperature control.

In the second embodiment, after one ends, which are connected with the power return line 340, of the temperature control units 321 of the six temperature control modules 320 at a same row of the matrix are serially connected, the temperature control units 321 at different rows are parallel connected. Finally, by connecting one port of the electrostatic chuck for power supply return with the power return line 340, it is implemented that all temperature control units 321 are connected with one common power return line only through one port of the electrostatic chuck for power supply return.

After one ends, which are connected with the power supply line, of the semiconductor switches 322 of four temperature control modules 320 at a same row are serially connected, one ends, which are connected with the power supply line, of the semiconductor switches 322 at different rows are parallel connected, they are finally connected with one power supply line 330 through one port of the electrostatic chuck for power supply, thereby implementing that all temperature control units 321 are connected with a common power supply line with only one port of the electrostatic chuck for power supply.

Gate electrodes of the semiconductor switches 322 of all temperature control modules 320 are connected with 24 different output channels of one or more gate drivers, respectively. The gate drivers perform drive control to the 24 temperature control modules 220, respectively.

With an electrostatic chuck of a matrix temperature control system containing N square temperature control modules as an example, an electrostatic chuck having a temperature control system needs to be equipped in total with N ports for connecting the power supply line and N ports for connecting the power return line. However, if the system structure revealed in the second embodiment is adopted, the situation will be apparently different from the prior art: the electrostatic chuck only needs to set N square ports of gate driving lines, one port for connecting the power supply line, and one port for connecting the power return line; the gate driving lines of the N square semiconductor switches are connected with the gate driver; output channels of one gate driver may satisfy a multi-zone (about 200 zones) temperature control electrostatic chuck. For a small-size gate driver, it may be designed inside the electrostatic chuck, which will bring a great advantage that: in order to control the electrostatic chuck with these almost 200 temperature control modules, it is only needed to set three ports, which can implement connections of all temperature control modules to the gate driver, the power supply line, and the power return line. Further, for an electrostatic chuck with 200 or more temperature control modules, it may be controlled by adding one or several gate drivers and integrate them into the electrostatic chuck.

The temperature control matrix 310 of the multi-zone active-matrix temperature control system disclosed in the second embodiment comprises 24 temperature control modules 320. It is designed that all temperature control modules 320 share one power supply line 330, and all temperature control modules 320 share one power return lines 340; on and off of each temperature control module 320 is implemented by controlling on and off of the gate electrodes of the semiconductor switch 322. Therefore, this proposed design contains 24 gate driving lines. The 24 gate driving lines of semiconductor switches are accessed to different output channels of a same gate driver.

A temperature control method for the multi-zone active-matrix temperature control system according to the second embodiment specifically comprises the following steps:

Step 2.1: the power supply line 330 and the power return line 340 provide a power supply loop for all temperature control modules 320 in the temperature control matrix 310.

Step 2.2: the gate driver conducts, according to a location where the temperature adjusting zone, semiconductors 322 of the temperature control module 320 at the corresponding location.

Step 2.3: the semiconductor switches 322 of the temperature control modules 320 are turned on to conduct; when the power supply line 330 supplies power thereto, the temperature control unit 321 heats to perform temperature control to the electrostatic chuck.

Further, when executing the temperature control method, by adjusting the accessed voltage, or current, or switching-on time of the corresponding power supply line 330, control of a duty cycle of the temperature adjusting zone is implemented.

Such design of the multi-zone temperature control electrostatic chuck has an advantage that because each temperature control module 320 is independent from one another, no electrical interference exists among the temperature control modules 320; therefore, control of the temperature adjusting zone within the electrostatic chuck is highly flexible and accurate; which may implement arbitrary independent control of individual temperature control modules 320 in multiple zones that need temperature control, without any restriction; meanwhile, by controlling switching times and switching time of the semiconductor switches 322 of the temperature control modules 320 corresponding to each temperature adjusting zone t, the objective of controlling the temperature control duty cycle of each temperature adjusting zone will be achieved.

Although the content of the present invention has been introduced in detail through the preferred embodiments above, it should be appreciated that the depiction above should not be regarded as a limitation to the present invention. After having read the content above, various modifications and substitutions to the present invention will be obvious to those skilled in the art. Therefore, the protection scope of the present invention should be limited by the appended claims.

What is claimed is:

1. A method of temperature control for a multi-zone active-matrix temperature control system, wherein, the multi-zone active-matrix temperature control system comprises a temperature control matrix and a gate driver; the temperature control matrix comprises:

temperature control modules forming a matrix, a power supply line, and a power return line;

each temperature control module comprises: a heater; a semiconductor switch with a gate electrode connected to the gate driver, the semiconductor switch further including other two electrodes first electrode being connected to the power supply line, and second electrode connected to the power return line through the heater, respectively, selectively connect said two electrodes according to the signal on gate electrode, the temperature control method comprising:

supplying power, by the power supply line, to the temperature control modules in a temperature adjusting zone;

turning on the semiconductor switches corresponding to the temperature adjusting zone by the gate driver;

powering on and heating up the heaters in the temperature adjusting zone.

2. The method of temperature control according to claim 1, wherein, all temperature control modules are connected to a common power return line; the first electrodes of semiconductor switches of temperature modules in a same column are serially connected; the temperature control modules in one common column are connected to one line of power supply lines respectively; gate electrodes of semiconductor switches of temperature control modules in a same row are serially connected; the temperature control modules in one common row are connected to one line of gate driver output lines, respectively;

the temperature control method comprises:

supplying driving signal by the gate driver, turning on semiconductor switches in the temperature control modules determined by said driving signal for a unit time and then off;

when the gate driver turn on the semiconductor switches of temperature control modules in the temperature adjusting zone I supplying power, by the power supply line, to the temperature control modules in the column determined by temperature adjusting zone.

3. The temperature control method according to claim 2, wherein, the manner in which the gate driver turns on semiconductor switches of part of temperature control modules is that: the gate driver sweeps row by row according to a preset sequence, to turn on the semiconductor switches of the temperature control modules for a unit time and then off.

4. The temperature control method according to claim 2, wherein, the manner in which the gate driver turns on semiconductor switches of part of temperature control modules is that: determining the row defined by temperature adjusting zone, the gate driver turns on semiconductor switches of the temperature control modules in the corresponding row for a unit time and then off.

5. The temperature control method according to claim 1, wherein, all temperature control modules are connected with one power return line and one power supply line; each semiconductor switch of each temperature control module are connected with one line of gate driver output, respectively;

the temperature control method comprises:

turning on the semiconductor switches of the temperature control modules in the temperature adjusting zone, and supplying power, by the power supply line, to the temperature control modules whose semiconductor switches are turned on.

6. The temperature control method according to claim 1, wherein, the power supply line supplies heating power to the heaters in temperature adjusting zone, wherein the voltage, current, or power supply duration of heating power has variable duty cycle.

7. A method for providing multi-zone active-matrix temperature control, comprising:

fabricating a temperature control matrix and a gate driver by fabricating N*M temperature control modules in N-rows and M-columns, power supply lines, and power return lines;

for each temperature control module providing:

a heater;

a gate driving line;

a semiconductor switch;

connecting a gate electrode of the semiconductor switch to the gate driver via the gate driving line, one electrode of the semiconductor switch being connected with one of the power supply lines, and another electrode of the semiconductor switch connected to the heater;

in the temperature control matrix, serially connecting a first end of the heater in each of the temperature control modules in a same row or same column to one of the power return lines that is common to the same row or same column;

serially connecting the semiconductor switch each of the temperature control modules in a same row or a same column to one of the power supply lines that is common to the same row or same column; and, connecting all of the power return lines directly to one common power return line to form a single lead-out line of the multi-zone active-matrix temperature control system;

serially connecting the semiconductor switches in the temperature control modules in the same column are to a common power supply line of M columns of temperature control modules respectively connect to M power supply lines; the M power supply lines selectively supply power to the temperature control modules in their respective connected columns;

connecting all of the power return lines directly to one common power return line forming a single lead-out line of the multi-zone active-matrix temperature control system.

8. The method according to claim 7, wherein providing a semiconductor switch comprises providing thin film transistors or triodes.

9. The method of claim 7, further comprising installing the multi-zone active-matrix temperature control system in an electrostatic chuck having an electrostatic adsorption assembly at top portion for fixing a wafer.

10. The method of claim 9, further comprising integrating the gate driver inside the electrostatic chuck.

11. A method of providing multi-zone active-matrix temperature control, comprising:

fabricating a multi-zone active-matrix temperature control system with a temperature control matrix and a gate driver; the temperature control matrix having N*M temperature control modules forming a N-row M-column matrix, power supply lines, and power return lines;

for each temperature control module providing:

a heater;

a gate driving line;

a semiconductor switch;

connecting a gate electrode of the semiconductor switch to the gate driver via the gate driving line, connecting one electrode of the semiconductor switch with one of the power supply lines, and connecting another electrode of the semiconductor switch connected to the heater;

serially connecting a first end of the heater in each of the temperature control modules in a same row or same column to one of the power return lines that is common to the same row or same column, and serially connecting the semiconductor switch of each of the temperature control modules in a same row or a same column to one of the power supply lines that is common to the same row or same column; and, directly connecting all of the power return lines to one common power return line forming a single lead-out line of the multi-zone active-matrix temperature control system;

serially connecting the semiconductor switches in the temperature control modules in the same column to a common power supply line of M columns of temperature control modules;

energizing M power supply lines to supply power to the temperature control modules in their respective connected columns;

serially connecting the gate electrodes of semiconductor switches of temperature control modules in a same row to a common gate driving line;

connecting N rows of temperature control modules to N gate driving lines;

connecting the N gate driving lines with one or more gate drivers, respectively; and, operating the gate driver to control the N rows of temperature control modules.

12. The method of claim 11, further comprising installing the multi-zone active-matrix temperature control system in an electrostatic chuck having an electrostatic adsorption assembly at top portion for fixing a wafer.

13. The method of claim 12, further comprising integrating the gate driver inside the electrostatic chuck.

14. A method of temperature control, comprising:
fabricating a multi-zone active-matrix temperature control system with a temperature control matrix and a gate driver; the temperature control matrix having N*M temperature control modules forming a N-row M-column matrix, power supply lines, and power return lines;

for each temperature control module providing:
a heater;
a gate driving line;
a semiconductor switch provided with a gate electrode connected to the gate driver via the gate driving line, one electrode of the semiconductor switch being connected with one of the power supply lines, and another electrode of the semiconductor switch connected to the heater;

in the temperature control matrix, each of the temperature control modules in a same row or same column has a first end of its heater serially connected to one of the power return lines that is common to the same row or same column, and each of the temperature control modules in a same row or a same column has its semiconductor switch serially connects to one of the power supply lines that is common to the same row or same column; and, wherein all of the power return lines are directly connected to one common power return line forming a single lead-out line of the multi-zone active-matrix temperature control system; and, wherein, in the temperature control matrix, the semiconductor switches of all temperature control modules are connected to one common power supply line;

the gate electrode of semiconductor switches in each temperature control module is connected to at least one gate driver; the gate driver controls each temperature control module, respectively.

15. The method of claim 14, further comprising installing the multi-zone active-matrix temperature control system in an electrostatic chuck having an electrostatic adsorption assembly at top portion for fixing a wafer.

16. The method of claim 15, further comprising integrating the gate driver inside the electrostatic chuck.

* * * * *